United States Patent
Kobayashi

(10) Patent No.: US 9,474,164 B2
(45) Date of Patent: Oct. 18, 2016

(54) MODULE, ELECTRONIC APPARATUS, MOVING OBJECT, AND METHOD OF MANUFACTURING MODULE

(71) Applicant: Seiko Epson Corporation, Tokyo (JP)

(72) Inventor: Tomonaga Kobayashi, Chino (JP)

(73) Assignee: Seiko Epson Corporation (JP)

(*) Notice: Subject to any disclaimer, the term of this patent is extended or adjusted under 35 U.S.C. 154(b) by 81 days.

(21) Appl. No.: 14/217,625

(22) Filed: Mar. 18, 2014

(65) Prior Publication Data
US 2014/0285976 A1    Sep. 25, 2014

(30) Foreign Application Priority Data

Mar. 19, 2013  (JP) ................................ 2013-056201

(51) Int. Cl.
| | | |
|---|---|---|
| H05K 1/14 | (2006.01) | |
| H05K 3/04 | (2006.01) | |
| G01P 1/02 | (2006.01) | |
| G01P 15/125 | (2006.01) | |
| G01C 19/5769 | (2012.01) | |
| H01L 23/14 | (2006.01) | |
| H01L 23/15 | (2006.01) | |

(52) U.S. Cl.
CPC ............. *H05K 3/04* (2013.01); *G01C 19/5769* (2013.01); *G01P 1/023* (2013.01); *G01P 15/125* (2013.01); *H01L 23/147* (2013.01); *H01L 23/15* (2013.01); *H01L 2224/48091* (2013.01); *H01L 2224/48465* (2013.01); *Y10T 29/49156* (2015.01)

(58) Field of Classification Search
USPC ....... 361/736, 748, 760, 767, 777, 728–730; 257/776–778
See application file for complete search history.

(56) References Cited

U.S. PATENT DOCUMENTS

| | | | | | |
|---|---|---|---|---|---|
| 4,147,889 | A | * | 4/1979 | Andrews et al. | 174/546 |
| 4,445,274 | A | * | 5/1984 | Suzuki et al. | 29/832 |
| 4,849,857 | A | * | 7/1989 | Butt | H01L 23/42 |
| | | | | | 257/668 |
| 4,953,173 | A | * | 8/1990 | Fujitsu | 372/74 |
| 5,652,466 | A | * | 7/1997 | Hirakawa et al. | 257/772 |
| 7,190,062 | B1 | * | 3/2007 | Sheridan et al. | 257/686 |
| 7,432,602 | B2 | | 10/2008 | Kuramochi | |
| 2012/0049355 | A1 | | 3/2012 | Hosokawa et al. | |
| 2012/0111615 | A1 | | 5/2012 | Yoda et al. | |
| 2013/0208438 | A1 | | 8/2013 | Takagi | |

FOREIGN PATENT DOCUMENTS

| | | |
|---|---|---|
| JP | 2007-059596 A | 3/2007 |
| JP | 2012-054353 A | 3/2012 |
| JP | 2012-098208 A | 5/2012 |
| JP | 2013-164285 A | 8/2013 |

* cited by examiner

*Primary Examiner* — Hung S Bui
(74) *Attorney, Agent, or Firm* — Harness, Dickey & Pierce, P.L.C.

(57) ABSTRACT

A module includes an insulating substrate having an upper surface as a principal surface, a lid member having an internal space with the insulating substrate, and bonded to the upper surface in a first surface, a device element housed in the internal space, a semiconductor element connected to a top surface, which forms the both sides of the lid member together with the first surface, using a resin adhesive, electrodes electrically connected to the device element, and disposed on an upper surface of the insulating substrate in an area other than the connection area with the lid member, and a projection section formed of the same member as the lid member on the upper surface in an area between the electrodes and the lid member in a plan view.

12 Claims, 8 Drawing Sheets

MODULE, ELECTRONIC APPARATUS, MOVING OBJECT, AND METHOD OF MANUFACTURING MODULE

BACKGROUND

1. Technical Field

The invention relates to a module, a method of manufacturing the module, an electronic apparatus using the module, and a moving object.

2. Related Art

In the past, as an example of a module, there has been proposed a semiconductor device having a semiconductor chip as a functional element mounted on a base substrate. In this semiconductor device, as a method of connecting the base substrate and the semiconductor chip to each other, there are used a flip-chip connection using, for example, a solder bump or a gold bump, a die attachment using a resin adhesive, and so on. In the flip-chip connection, the gap between the semiconductor chip and the base substrate is filled with resin called underfill resin. Further, in the die attachment, there is disposed a resin adhesive between the semiconductor chip and the base substrate. The underfill resin and the resin adhesive are high in fluidity, and in some cases, the resin component flows out to the periphery. There is disclosed an example in which a dam for stopping the flow is disposed so as to surround the periphery of the semiconductor chip (see, e.g., JP-A-2007-59596 and JP-A-2012-54353).

However, in the configuration described above, the dam for stopping the flow of the resin is formed of, for example, solder or resist, and the process for forming the dam is required. In other words, it results that the man-hour for forming the dam is required additionally, which contributes to the increase in cost of the semiconductor device (the module).

SUMMARY

An advantage of some aspects of the invention is to solve at least a part of the problems described above, and the invention can be implemented as the following aspects or application examples.

Application Example 1

This application example is directed to a module including a first base member, a second base member having an internal space with the first base member, and bonded to a principal surface of the first base member, a first functional element housed in the internal space, a second functional element connected to a surface of the second base member on an opposite side to the internal space with a bonding member, an electrode electrically connected to the first functional element, and disposed on the principal surface of the first base member in an area other than a connection area with the second base member, and a projection section formed of a same member as the second base member, and disposed on the principal surface in an area between the electrode and the second base member in a plan view.

According to this application example, the projection section formed of the same member as the second base member is disposed on the principal surface in an area between the electrode and the second base member in the plan view. Thus, even in the case in which the bonding material for bonding the second functional element to the top surface of the second base member flows, the bonding material having flown can be stopped by the projection section. Therefore, the bonding material having flown fails to reach the electrode, and the contamination of the electrode by the bonding material can be inhibited. Further, since the projection section is formed of the same member as the second base member, the projection section can be disposed without requiring additional process, and increase in manhour can be suppressed.

Application Example 2

In the module according to the application example described above, it is preferable that a distance between the projection section and the second base member on a tip side of the projection section is longer than a distance between the projection section and the second base member on the principal surface side.

According to this application example, the projection section is disposed so that the distance between the projection section and the second base member on the tip side of the projection section is longer than the distance between the projection section and the second base member on the principal surface side. In other words, the shorter the distance from the principal surface is, the shorter the distance between the projection section and the second base member is, and the higher the surface tension with the bonding material having flown becomes. Thus, it becomes possible to enhance the stopping effect of the bonding material in the part near to the principal surface, and thus, the flow of the bonding material can more reliably be stopped.

Application Example 3

In the module according to the application example described above, it is preferable that the second base member has a slope as a side surface near to an area where the projection section is provided.

According to this application example, since the side surface of the second base member is formed as a slope, the outflow resistance of the bonding material having flown is increased, or the plane area is increased due to the slope to elongate the outflow length. Therefore, it becomes possible to reduce the amount of the bonding material, which reaches the projection section, and the flow of the bonding material can more surely be stopped by the projection section.

Application Example 4

In the module according to the application example described above, it is preferable that the second functional element is connected so as to project from the surface of the second base member on the opposite side to the internal space toward the electrode.

According to this application example, since the second functional element is connected so as to project from the top surface of the second base member toward the electrode, the distance between the second functional element and the projection section in the plan view is decreased, and the distance between the second functional element and the electrode in the plan view is also decreased. Thus, it becomes easy for the wiring lines to stride over the projection section, thus the wiring lines can be prevented from having contact with the projection section, and at the same time, the wiring lines between the second functional element and the electrodes can be shortened, and thus, it becomes easy to form a wiring shape.

Application Example 5

In the module according to the application example described above, it is preferable that the principal surface of the first base member is provided with a groove, the first functional element and the electrode are electrically connected to each other with a wiring line disposed in the groove, and the groove is filled with a sealing member disposed in a gap between the projection section and the second base member.

According to this application example, since the groove provided with the wiring line is filled with the sealing member, it is possible to achieve the electrical connection between the first functional element and the electrode, and at the same time, enhance the sealing property (airtightness) of the internal space housing the first functional element.

Application Example 6

This application example is directed to a method of manufacturing a module including preparing a second base member provided with a first recessed section having a first wall section, and a second recessed section having a second wall section both disposed in a first surface, and a first base member having a hollow section disposed in a principal surface, bonding the second base member and the first base member to each other so that the first recessed section and the hollow section are opposed to each other, and removing the second base member in an area where the second recessed section and the second wall section are formed so that a part of the second wall section remains.

According to this application example, the projection section can be disposed using a part of the second wall section disposed on the second base member. Therefore, the projection section can be disposed with a simple and easy process to suppress increase in man-hour.

Application Example 7

In the method of manufacturing a module according to the application example described above, it is preferable that a half dicing process is used in removing of the second base member.

According to this application example, the projection section can be disposed with a simple and easy process using the half dicing process.

Application Example 8

This application example is directed to an electronic apparatus equipped with the module according to any one of the application examples 1 through 5 described above.

According to this present application example, it becomes possible to provide an electronic apparatus low in cost and stable in characteristics using the module suppressing increase in cost, and capable of inhibiting the contamination of the electrode by the bonding material.

Application Example 9

This application example is directed to a moving object equipped with the module according to any one of the application examples 1 through 5 described above.

According to this present application example, it becomes possible to provide a moving object low in cost and stable in characteristics using the module suppressing increase in cost, and capable of inhibiting the contamination of the electrode by the bonding material.

BRIEF DESCRIPTION OF THE DRAWINGS

The invention will be described with reference to the accompanying drawings, wherein like numbers reference like elements.

FIGS. 5A and 5B are diagrams schematically showing a module according to a second embodiment of the invention, wherein FIG. 5A is a plan view, and FIG. 5B is a front cross-sectional view.

DESCRIPTION OF EXEMPLARY EMBODIMENTS

Some exemplary embodiments of the invention will hereinafter be described with reference to the accompanying drawings.

First Embodiment

Figure 1:
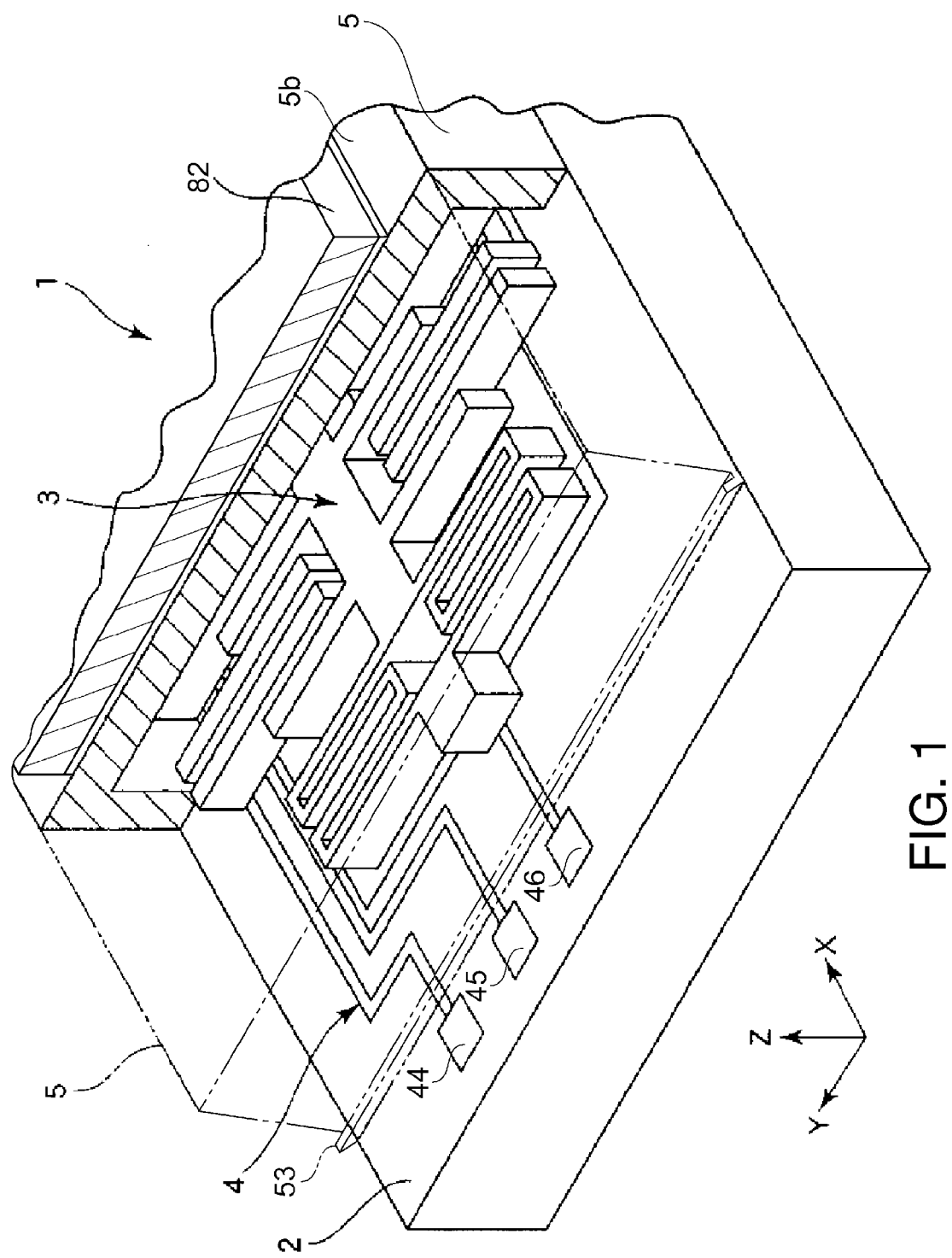
FIG. 1 is a perspective view schematically showing a module according to a first embodiment of the invention.
Figure 2:
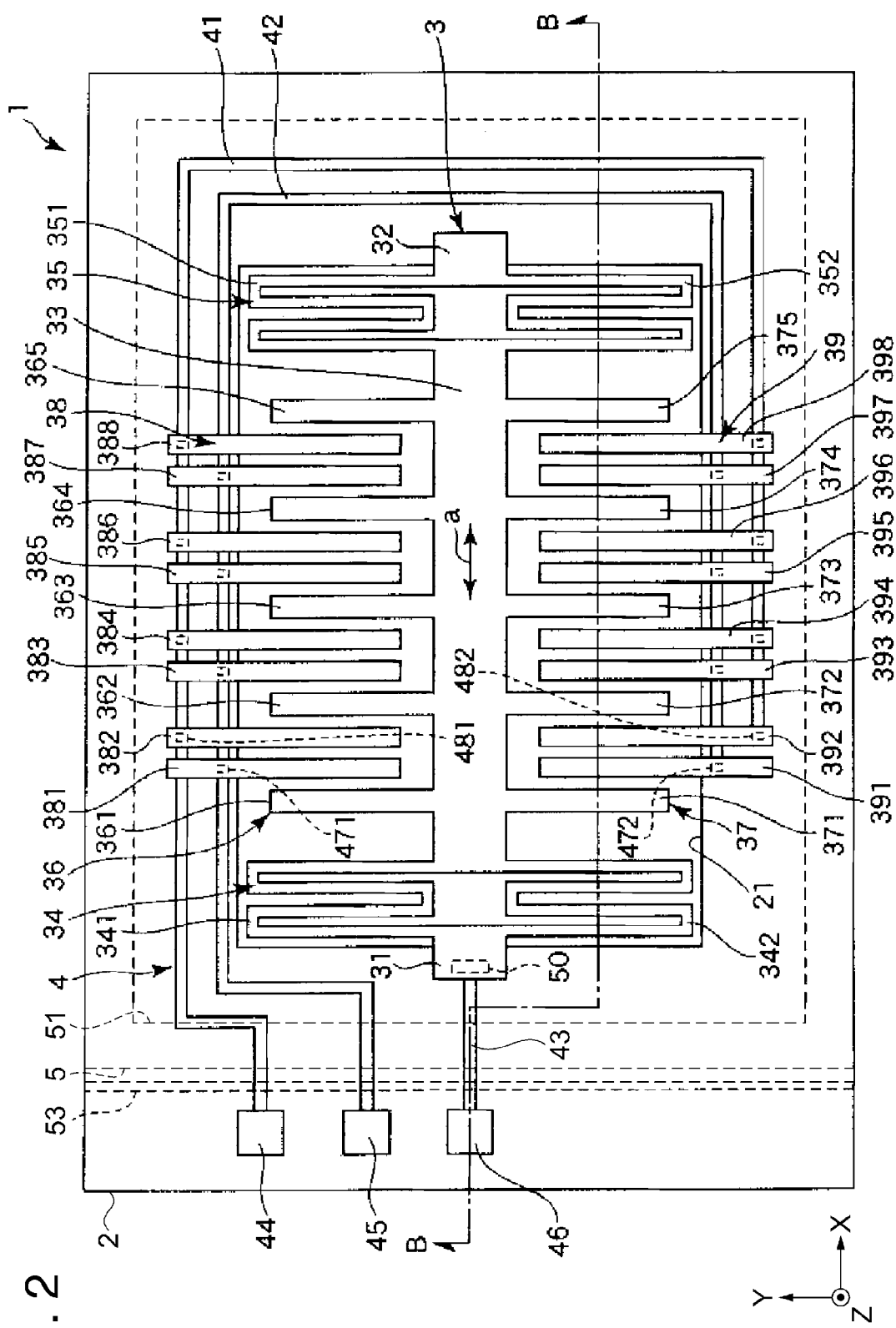
FIG. 2 is a plan view schematically showing the module shown in FIG. 1.
Figure 3:
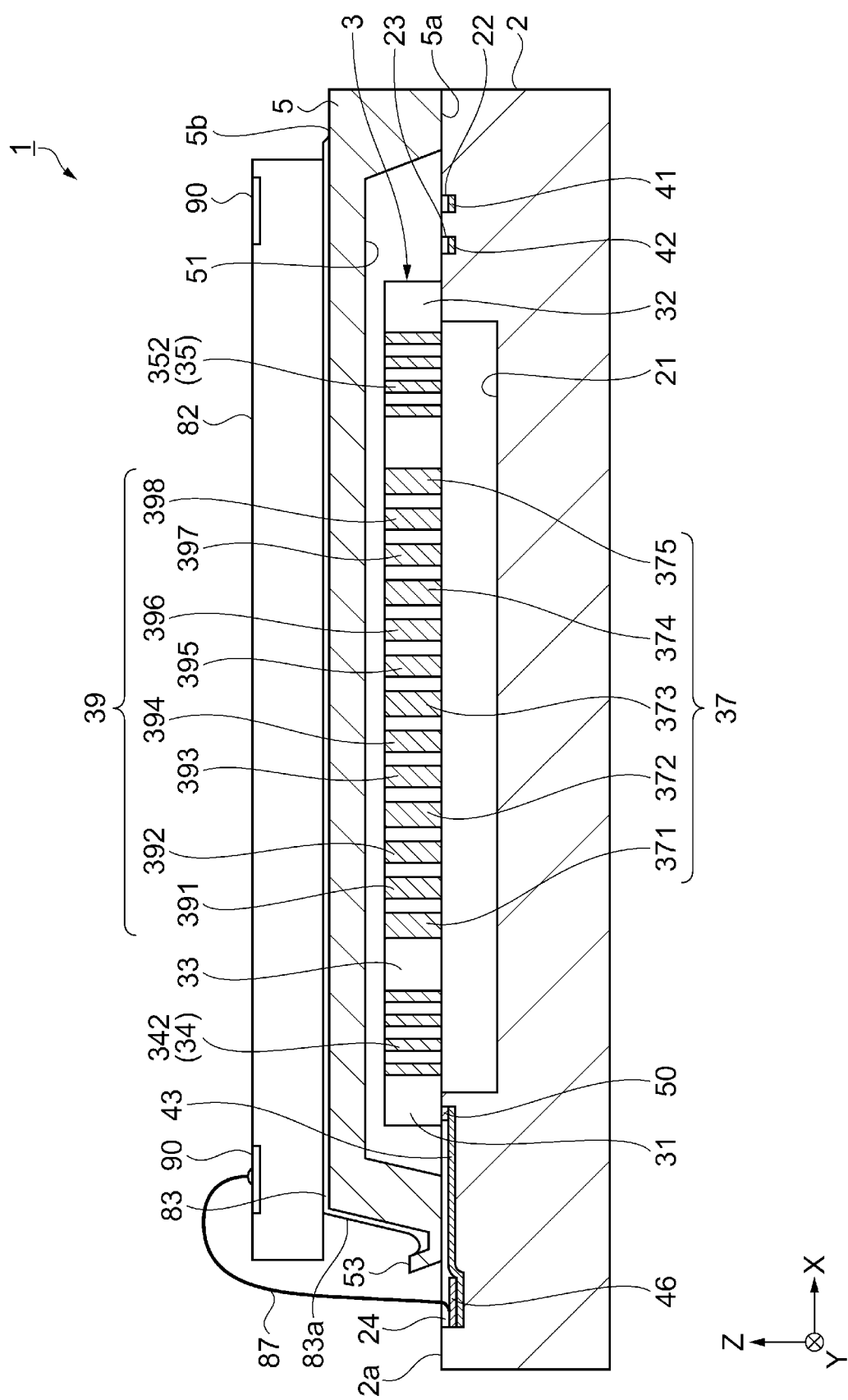
FIG. 3 is a cross-sectional view along the B-B line showing the module shown in FIG. 2.

A module according to the first embodiment of the invention will be explained using FIGS. 1 through 3. FIG. 1 is a perspective view schematically showing the module according to the first embodiment of the invention. FIG. 2 is a plan view schematically showing the module shown in FIG. 1, and is a diagram with a lid member omitted (viewed through the lid member). FIG. 3 is a cross-sectional view along the B-B line showing the module shown in FIG. 2. It should be noted that in FIGS. 1 and 3, the X axis, the Y axis, and the Z axis are shown as three axes perpendicular to each other. Hereinafter, a direction (a horizontal direction) parallel to the X axis is referred to as an "X-axis direction," a direction parallel to the Y axis is referred to as a "Y-axis direction," and a direction (a vertical direction) parallel to the Z axis is referred to as a "Z-axis direction." Further, the near side (in the Z-axis direction) of the sheet of FIG. 2 is referred to as an "upper side," the far side (in the Z-axis direction) of the sheet is referred to as a "lower side," the right side (in the X-axis direction) is referred to as a "right side," and the left side (in the X-axis direction) is referred to as a "left side" in the following descriptions for the sake of convenience of explanation. It should be noted that in the present embodiment, the explanation is presented assuming that an element as a first functional element is a physical quantity sensor element for measuring a physical quantity such as acceleration or angular velocity.

Module

The module 1 shown in FIG. 1 is provided with an insulating substrate 2 as a first base member, a device element 3 as a first functional element bonded to and supported by the insulating substrate 2, a conductor pattern 4 electrically connected to the device element 3, and a lid member 5 as a second base member disposed so as to cover the device element 3. Further, the module 1 is provided with a semiconductor element 82 as a second functional element connected to the lid member 5, electrodes 44, 45, and 46 disposed on an upper surface 2a (one of the surfaces) of the insulating substrate 2 not covered by the lid member 5, and a projection section 53 disposed between the lid member 5 and the electrodes 44, 45, and 46 in a plan view. It should be noted that the plan view in this case denotes the state viewed from the direction from the lid member 5 side toward the insulating substrate 2 side, and in the following explanation, the plan view also denotes the state viewed from the similar direction. Hereinafter, each of the sections constituting the module 1 will sequentially be explained in detail.

Insulating Substrate as First Base Member

Firstly, the insulating substrate 2 as the first base member will be explained using FIGS. 2 and 3. The insulating substrate 2 as the first base member has a function of supporting the device element 3 as the first functional element. The insulating substrate 2 has a plate like shape, and the upper surface 2a (the one of the surfaces) as a principal surface is provided with a hollow section 21 as a part of an internal space. The hollow section 21 is formed so as to include a movable section 33, movable electrode sections 36, 37, and connection sections 34, 35 of the device element 3 described later in the plan view of the insulating substrate 2, and has an inner bottom. Such a hollow section 21 constitutes a clearance for preventing the movable section 33, the movable electrode sections 36, 37, and the connection sections 34, 35 of the device element 3 from having contact with the insulating substrate 2. Thus, the displacement of the movable section 33 of the device element 3 can be allowed.

It should be noted that the clearance can be an opening section penetrating the insulating substrate 2 in the thickness direction instead of the hollow section 21 (having a recessed shape with the inner bottom). Further, in the first embodiment, the planar shape of the hollow section 21 forms a quadrangle (specifically a rectangle), but is not limited to the quadrangle.

Further, the upper surface 2a of the insulating substrate 2 is provided with recessed sections 22, 23, and 24 dug from the upper surface 2a and disposed outside the hollow section 21 along the periphery of the hollow section 21. The recessed sections 22, 23, and 24 form a shape corresponding to the conductor pattern 4 in the plan view. Specifically, the recessed section 22 forms a shape corresponding to a wiring line 41 and an electrode 44 of the conductor pattern 4 described later, the recessed section 23 forms a shape corresponding to a wiring line 42 and an electrode 45 of the conductor pattern 4 described later, and the recessed section 24 forms a shape corresponding to a wiring line 43 and an electrode 46 of the conductor pattern 4 described later.

Further, the depth of a region of the recessed section 22 where the electrode 44 is disposed is made deeper than a region of the recessed section 22 where the wiring line 41 is disposed. Similarly, the depth of a region of the recessed section 23 where the electrode 45 is disposed is made deeper than a region of the recessed section 23 where the wiring line 42 is disposed. Further, the depth of a region of the recessed section 24 where the electrode 46 is disposed is made deeper than a region of the recessed section 24 where the wiring line 43 is disposed.

By making the depth of a part of each of the recessed sections 22, 23, and 24 deeper, the substrate not yet provided with the device element 3 can be prevented from being bonded to the electrodes 44, 45, and 46 in the manufacturing process of the module 1.

As the constituent material of the insulating substrate 2, specifically, a silicon material and a glass material having a high resistivity are preferably used, and in particular, in the case in which the device element 3 is made of the silicon material as a chief material, a glass material (e.g., borosilicate glass such as Pyrex (registered trademark) glass) including an alkali metal ion (a movable ion) is preferably used. Thus, in the case in which the device element 3 is formed using silicon as a chief material, anodic bonding of the insulating substrate 2 and the device element 3 can be performed.

Further, it is preferable that the difference in thermal expansion coefficient between the constituent material of the insulating substrate 2 and the constituent material of the device element 3 is as small as possible, and specifically, the difference in thermal expansion coefficient between the constituent material of the insulating substrate 2 and the constituent material of the device element 3 is preferably equal to or smaller than 3 ppm/° C. Thus, even in the case in which the insulating substrate 2 and the device element 3 are exposed to a high temperature environment when bonding the insulating substrate 2 and the device element 3 to each other, the residual stress between the insulating substrate 2 and the device element 3 can be reduced.

Device Element as First Functional Element

Then, the device element 3 will be explained using FIGS. 2 and 3. The device element 3 is composed of fixation sections 31, 32, the movable section 33, the connection sections 34, 35, the movable electrode sections 36, 37, and stationary electrode sections 38, 39. The fixation sections 31, 32, the movable section 33, the connection sections 34, 35, and the movable electrode sections 36, 37 are formed integrally.

In the device element 3, the movable section 33 and the movable electrode sections 36, 37 are displaced in the X-axis direction (the +X-axis direction or the −X-axis direction) in accordance with the variation of the physical quantity such as the acceleration or the angular velocity while elastically deforming the connection sections 34, 35. Due to such a displacement, each of the gap between the movable electrode section 36 and the stationary electrode section 38 and the gap between the movable electrode section 37 and the stationary electrode section 39 varies in size. Therefore, due to such a displacement, each of the capacitance between the movable electrode section 36 and the stationary electrode section 38 and the capacitance between the movable electrode section 37 and the stationary electrode section 39 varies in amount. Therefore, the physical quantity such as the acceleration or the angular velocity can be detected based on these capacitance values.

The fixation sections 31, 32 are each bonded to the upper surface 2a of the insulating substrate 2 described above. Specifically, the fixation section 31 is bonded to a part of the upper surface 2a of the insulating substrate 2 on the −X-axis direction side (the left side in the drawing) with respect to the hollow section 21, and the fixation section 32 is bonded to a part of the upper surface 2a of the insulating substrate 2 on the +X-axis direction side (the right side in the drawing) with respect to the hollow section 21. Further, the fixation sections 31, 32 are each disposed so as to straddle the peripheral edge of the hollow section 21 in the plan view.

It should be noted that the positions, the shapes, and so on of the fixation sections 31, 32 are determined in accordance with the positions, the shapes, and so on of the connection sections 34, 35, the conductor pattern 4, and so on, and are not limited to those described above.

The movable section 33 is disposed between the two fixation sections 31, 32. In the present embodiment, the movable section 33 has an elongated shape extending in the X-axis direction. It should be noted that the shape of the movable section 33 is determined in accordance with the shapes, the sizes, and so on of the sections constituting the device element 3, and is not limited to that described above.

The movable section 33 is connected to the fixation section 31 via the connection section 34, and is connected to the fixation section 32 via the connection section 35. More specifically, a left end portion of the movable section 33 is connected to the fixation section 31 via the connection section 34, and a right end portion of the movable section 33 is connected to the fixation section 32 via the connection section 35. The connection sections 34, 35 connect the movable section 33 to the fixation sections 31, 32 in a displaceable manner. In the present embodiment, the connection sections 34, 35 are configured so as to be able to displace the movable section 33 in the X-axis direction (the +X-axis direction or the −X-axis direction) as indicated by the arrow "a" in FIG. 2.

In the specific explanation, the connection section 34 is composed of two beams 341, 342. Further, the beams 341, 342 each form a shape extending in the X-axis direction while meandering in the Y-axis direction. In other words, the beams 341, 342 each form a shape folded a plurality of number of times (three times in the present embodiment) in the Y-axis direction. It should be noted that the number of times of the folding of each of the beams 341, 342 can be one or two, or can be four or more.

Similarly, the connection section 35 is composed of two beams 351, 352 each forming a shape extending in the X-axis direction while meandering in the Y-axis direction. It should be noted that the connection section 34, 35 are not limited to those described above providing the movable section 33 is supported in a displaceable manner with respect to the insulating substrate 2. For example, the connection sections 34, 35 can be formed of a pair of beams respectively extending from the both end portions of the movable section 33 in the +Y-axis direction and the −Y-axis direction.

The movable electrode section 36 is disposed on one side (the +Y-axis direction side) in the width direction of the movable section 33, which is supported so as to be able to be displaced in the X-axis direction with respect to the insulating substrate 2 in such a manner as described above, and the movable electrode section 37 is disposed on the other side (the −Y-axis direction side). The movable electrode section 36 is opposed to the stationary electrode section 38 with a gap. Further, the movable electrode section 37 is opposed to the stationary electrode section 39 with a gap.

The movable electrode section 36 is provided with a plurality of movable electrode fingers 361 through 365 projecting from the movable section 33 in the +Y-axis direction, and arranged to forma comb-like shape. The movable electrode fingers 361, 362, 363, 364, and 365 are arranged in a direction from the −X-axis direction side toward the +X-axis direction side in this order. Similarly, the movable electrode section 37 is provided with a plurality of movable electrode fingers 371 through 375 projecting from the movable section 33 in the −Y-axis direction, and arranged to forma comb-like shape. The movable electrode fingers 371, 372, 373, 374, and 375 are arranged in a direction from the −X-axis direction side toward the +X-axis direction side in this order.

As described above, the plurality of movable electrode fingers 361 through 365 and the plurality of movable electrode fingers 371 through 375 are each disposed so as to be arranged in a direction (i.e., the Y-axis direction) along which the movable section 33 is displaced. Thus, it is possible to efficiently vary the capacitance between stationary electrode fingers 382, 384, 386, and 388 and the movable electrode section 36, and the capacitance between the stationary electrode fingers 381, 383, 385, and 387 and the movable electrode section 36 in accordance with the displacement of the movable section 33. Similarly, it is possible to efficiently vary the capacitance between stationary electrode fingers 392, 394, 396, and 398 and the movable electrode section 37, and the capacitance between the stationary electrode fingers 391, 393, 395, and 397 and the movable electrode section 37 in accordance with the displacement of the movable section 33. Therefore, it is possible to make the detection accuracy excellent in the case of using the module 1 as a physical quantity sensor device.

The stationary electrode section 38 is provided with the plurality of stationary electrode fingers 381 through 388 arranged to form a comb-like shape interdigitated with gaps with the plurality of movable electrode fingers 361 through 365 of the movable electrode section 36 described above. An end portion of each of such a plurality of stationary electrode fingers 381 through 388 on an opposite side to the movable section 33 is bonded to a part of the upper surface 2a of the insulating substrate 2 on the +Y-axis direction side with respect to the hollow section 21. Further, in each of the stationary electrode fingers 381 through 388, the end on the bonded side acts as a fixed end, and a free end extends toward the −Y-axis direction.

The stationary electrode fingers 381 through 388 are arranged in a direction from the −X-axis direction side toward the +X-axis direction side in this order. Further, the stationary electrode fingers 381, 382 form a pair and are disposed so as to approach between the movable electrode fingers 361, 362 described above, the stationary electrode fingers 383, 384 form a pair and are disposed so as to approach between the movable electrode fingers 362, 363, the stationary electrode fingers 385, 386 form a pair and are disposed so as to approach between the movable electrode fingers 363, 364, and the stationary electrode fingers 387, 388 form a pair and are disposed so as to approach between the movable electrode fingers 364, 365.

Here, the stationary electrode fingers 382, 384, 386, and 388 each correspond to a first stationary electrode finger, and the stationary electrode fingers 381, 383, 385, and 387 each correspond to a second stationary electrode finger separated from the first stationary electrode finger on the insulating substrate 2 with an air gap (a gap). As described above, the plurality of stationary electrode fingers 381 through 388 is constituted by the plurality of first stationary electrode fingers and the plurality of second stationary electrode fingers arranged alternately. In other words, the first stationary electrode finger is disposed on one side of the movable electrode finger, and the second stationary electrode finger is disposed on the other side.

The first stationary electrode fingers 382, 384, 386, and 388 and the second stationary electrode fingers 381, 383, 385, and 387 are separated from each other on the insulating substrate 2. In other words, the first stationary electrode fingers 382, 384, 386, and 388 and the second stationary electrode fingers 381, 383, 385, and 387 are not connected to each other on the insulating substrate 2, and are isolated like islands. Thus, it is possible to electrically insulate the first stationary electrode fingers 382, 384, 386, and 388 and the second stationary electrode fingers 381, 383, 385, and 387 from each other. Therefore, it is possible to separately measure the capacitance between the first stationary electrode fingers 382, 384, 386, and 388 and the movable electrode section 36 and the capacitance between the second stationary electrode fingers 381, 383, 385, and 387 and the movable electrode section 36 to detect the physical quantity based on the measurement results with high accuracy.

In the present embodiment, the stationary electrode fingers 381 through 388 are separated from each other on the insulating substrate 2. In other words, the stationary electrode fingers 381 through 388 are not connected to each other on the insulating substrate 2, and are isolated like islands. Thus, it is possible to uniform the lengths of the stationary electrode fingers 381 through 388 in the Y-axis direction. Therefore, it is possible to achieve miniaturization of the stationary electrode fingers 381 through 388 while keeping the area necessary to obtain sufficient bonding strength of the bonding section between each of the stationary electrode fingers 381 through 388 and the insulating substrate 2. Therefore, the miniaturization of the module 1 can be achieved while making the impact resistance of the module 1 excellent.

Similarly, the stationary electrode section 39 is provided with the plurality of stationary electrode fingers 391 through 398 arranged to form a comb-like shape interdigitated with gaps with the plurality of movable electrode fingers 371 through 375 of the movable electrode section 37 described above. An end portion of each of such a plurality of stationary electrode fingers 391 through 398 on an opposite side to the movable section 33 is bonded to a part of the upper surface 2a of the insulating substrate 2 on the −Y-axis direction side with respect to the hollow section 21. Further, in each of the stationary electrode fingers 391 through 398, the end on the bonded side acts as a fixed end, and a free end extends toward the +Y-axis direction.

The stationary electrode fingers 391, 392, 393, 394, 395, 396, 397, and 398 are arranged in a direction from the −X-axis direction side toward the +X-axis direction side in this order. Further, the stationary electrode fingers 391, 392 form a pair and are disposed so as to approach between the movable electrode fingers 371, 372 described above, the stationary electrode fingers 393, 394 form a pair and are disposed so as to approach between the movable electrode fingers 372, 373, the stationary electrode fingers 395, 396 form a pair and are disposed so as to approach between the movable electrode fingers 373, 374, and the stationary electrode fingers 397, 398 form a pair and are disposed so as to approach between the movable electrode fingers 374, 375.

Here, the stationary electrode fingers 392, 394, 396, and 398 each correspond to the first stationary electrode finger, and the stationary electrode fingers 391, 393, 395, and 397 each correspond to the second stationary electrode finger separated from the first stationary electrode finger on the insulating substrate 2 with an air gap (a gap). As described above, the plurality of stationary electrode fingers 391 through 398 is constituted by the plurality of first stationary electrode fingers and the plurality of second stationary electrode fingers arranged alternately. In other words, the first stationary electrode finger is disposed on one side of the movable electrode finger, and the second stationary electrode finger is disposed on the other side.

The first stationary electrode fingers 392, 394, 396, and 398 and the second stationary electrode fingers 391, 393, 395, and 397 are separated from each other on the insulating substrate 2 similarly to the case of the stationary electrode section 38. Thus, it is possible to separately measure the capacitance between the first stationary electrode fingers 392, 394, 396, and 398 and the movable electrode section 37 and the capacitance between the second stationary electrode fingers 391, 393, 395, and 397 and the movable electrode section 37 to detect the physical quantity based on the measurement results with high accuracy.

In the present embodiment, the plurality of stationary electrode fingers 391 through 398 are separated from each other on the insulating substrate 2 similarly to the case of the stationary electrode section 38 described above. Thus, it is possible to achieve miniaturization of the stationary electrode fingers 391 through 398 while making the area of the bonding section between each of the stationary electrode fingers 391 through 398 and the insulating substrate 2 sufficient. Therefore, the miniaturization of the module 1 can be achieved while making the impact resistance of the module 1 excellent.

The device element 3 (i.e., the fixation sections 31, 32, the movable section 33, the connection sections 34, 35, the plurality of stationary electrode fingers 381 through 388, and 391 through 398, and the plurality of movable electrode fingers 361 through 365, and 371 through 375) is formed by etching a single substrate described later.

Thus, it is possible to increase the thickness of each of the fixation sections 31, 32, the movable section 33, the connection sections 34, 35, the plurality of stationary electrode fingers 381 through 388, and 391 through 398, and the plurality of movable electrode fingers 361 through 365, and 371 through 375. Further, it is possible to uniform the thickness with ease and high accuracy. For the reason described above, increase in sensitivity of the module 1 can be achieved, and at the same time, the impact resistance of the module 1 can be improved.

Further, the constituent material of the device element 3 is not particularly limited providing the physical quantity can be detected based on the variation in the capacitances described above, but semiconductor is preferable, and specifically, a silicon material such as single-crystal silicon or polysilicon is preferably used. Therefore, it is preferable that the fixation sections 31, 32, the movable section 33, the connection sections 34, 35, the plurality of stationary electrode fingers 381 through 388, and 391 through 398, and the plurality of movable electrode fingers 361 through 365, and 371 through 375 are each formed using silicon as a chief material.

Silicon can be processed with high accuracy by etching. Therefore, by forming the device element 3 using silicon as a chief material, it is possible to make the dimensional accuracy of the device element 3 excellent, and as a result, increase in sensitivity of the module 1 as the physical quantity sensor device can be achieved. Further, since silicon is hardly fatigued, the durability of the module can also be improved. Further, an impurity such as phosphorus or boron is preferably doped in the silicon material constituting the device element 3. Thus, it is also possible to make the conductivity of the device element 3 excellent.

Further, as described above, the device element 3 is supported by the insulating substrate 2 by bonding the fixation sections 31, 32 and the stationary electrode sections 38, 39 to the upper surface 2a of the insulating substrate 2.

In the present embodiment, the insulating substrate 2 and the device element 3 are bonded to each other via an insulating film not shown.

The method of bonding the device element 3 (specifically, the fixation sections 31, 32 and the stationary electrode fingers 381 through 388, and 391 through 398 described above) and the insulating substrate 2 to each other is not particularly limited, but an anodic bonding method is preferably used. Thus, the fixation sections 31, 32 and the stationary electrode sections 38, 39 (the stationary electrode fingers 381 through 388, and 391 through 398) can tightly be bonded to the insulating substrate 2. Therefore, the impact resistance of the module 1 can be improved. Further, the fixation sections 31, 32 and the stationary electrode sections 38, 39 (the stationary electrode fingers 381 through 388, and 391 through 398) can be bonded to the desired positions of the insulating substrate 2 with high accuracy. Therefore, the increase in sensitivity of the module 1 as the physical quantity sensor device can be achieved. In this case, the device element 3 is formed using silicon as the chief material as described above, and at the same time, the insulating substrate 2 is formed using the glass material including the alkali metal ion.

Conductor Pattern

The conductor pattern 4 is disposed on the upper surface 2a (the surface on the stationary electrode sections 38, 39 side) of the insulating substrate 2 described above. The conductor pattern 4 is composed of the wiring lines 41, 42, and 43 and the electrodes 44, 45, and 46.

The wiring line 41 is disposed outside the hollow section 21 of the insulating substrate 2 described above, and formed along the periphery of the hollow section 21. Further, an end portion of the wiring line 41 is connected to the electrode 44 on a peripheral part (a part on the insulating substrate 2 outside the lid member 5) of the upper surface 2a of the insulating substrate 2. The wiring line 41 is electrically connected to each of the stationary electrode fingers 382, 384, 386, and 388, and each of the stationary electrode fingers 392, 394, 396, and 398 as the first stationary electrode fingers of the device element 3 described above. Here, the wiring line 41 corresponds to a first wiring line electrically connected to each of the first stationary electrode fingers.

Further, the wiring line 42 is disposed inside the wiring line 41 described above, outside the hollow section 21 of the insulating substrate 2 described above, and along the peripheral edge of the hollow section 21. Further, an end portion of the wiring line 42 is connected to the electrode 45 on the peripheral part (the part on the insulating substrate 2 outside the lid member 5) of the upper surface 2a of the insulating substrate 2 so as to be in line with the electrode 44 described above with an interval. Here, the wiring line 42 corresponds to a second wiring line electrically connected to each of the second stationary electrode fingers.

The wiring line 43 is disposed so as to extend from the bonding section with the fixation section 31 on the insulating substrate 2 to the surface of the peripheral part (the part on the insulating substrate 2 outside the lid member 5) of the upper surface 2a of the insulating substrate 2. Further, an end portion of the wiring line 43 on the opposite side to the fixation section 31 is connected to the electrode 46 on the peripheral part (the part on the insulating substrate 2 outside the lid member 5) of the upper surface 2a of the insulating substrate 2 so as to be in line with the electrodes 44, 45 described above with intervals.

The constituent material of such wiring lines 41 through 43 is not particularly limited providing the constituent material has conductivity, and a variety of electrode materials can be used. For example, ITO (indium tin oxide), IZO (indium zinc oxide), $In_2O_3$, $SnO_2$, Sb-doped $SnO_2$, an oxide of Al-doped ZnO (a transparent electrode material), Au, Pt, Ag, Cu, Al, or alloys including any of these metals can be cited, and can be used alone or in combination.

Among these materials, the transparent electrode material (in particular ITO) is preferably used as the constituent material of the wiring lines 41 through 43. If the wiring lines 41, 42 are each formed of the transparent electrode material, in the case in which the insulating substrate 2 is a transparent substrate, a foreign matter and so on existing on a surface of the insulating substrate 2, on which the stationary electrode sections 38, 39 are disposed, can easily be recognized visually from the opposite side of the insulating substrate 2 to the stationary electrode sections 38, 39. Therefore, the module 1 can be provided as the sensitive physical quantity sensor device.

Further, the constituent material of the electrodes 44 through 46 is not particularly limited providing the constituent material has conductivity similarly to the case of the wiring lines 41 through 43 described above, and a variety of electrode materials can be used. In the present embodiment, the same material as a constituent material of projections 471, 472, 481, and 482 described later is used as the constituent material of the electrodes 44 through 46.

Since such wiring lines 41, 42 (the first wiring line and the second wiring line) are disposed on the upper surface 2a of the insulating substrate 2, it is possible to measure the capacitance between the first stationary electrode fingers 382, 384, 386, and 388 and the movable electrode section 36 and the capacitance between the first stationary electrode fingers 392, 394, 396, and 398 and the movable electrode section 37 via the wiring line 41, and at the same time, to measure the capacitance between the second stationary electrode fingers 381, 383, 385, and 387 and the movable electrode section 36 and the capacitance between the second stationary electrode fingers 391, 393, 395, and 397 and the movable electrode section 37 via the wiring line 42.

In the present embodiment, by using the electrode and the electrode 46, it is possible to measure the capacitance between the first stationary electrode fingers 382, 384, 386, and 388 and the movable electrode section 36, and the capacitance between the first stationary electrode fingers 392, 394, 396, and 398 and the movable electrode section 37. Further, by using the electrode 45 and the electrode 46, it is possible to measure the capacitance between the second stationary electrode fingers 381, 383, 385, and 387 and the movable electrode section 36, and the capacitance between the second stationary electrode fingers 391, 393, 395, and 397 and the movable electrode section 37. Further, since such wiring lines 41, 42 are disposed on the upper surface 2a (i.e., on the surface on which the stationary electrode sections 38, 39 are disposed) of the insulating substrate 2, the electrical connection to the stationary electrode sections 38, 39 and the alignment for the connection are easy. Therefore, the reliability (in particular, the impact resistance and the detection accuracy) of the module 1 can be improved.

Further, the wiring line 41 and the electrode 44 are disposed inside the recessed section 22 of the insulating substrate 2 described above, the wiring line 42 and the electrode 45 are disposed inside the recessed section 23 of the insulating substrate 2 described above, and the wiring line 43 and the electrode 46 are disposed inside the recessed section 24 of the insulating substrate 2 described above.

Thus, the wiring lines 41 through 43 can be prevented from projecting from the surface (the upper surface 2a) of the insulating substrate 2. Therefore, the electrical connection between the stationary electrode fingers 382, 384, 386, 388, 392, 394, 396, and 398 and the wiring line 41 and the electrical connection between the stationary electrode fingers 381, 383, 385, 387, 391, 393, 395, and 397 and the wiring line 42 can be performed while securing the bonding (fixation) between the stationary electrode fingers 381 through 388 and 391 through 398, and the insulating substrate 2. Similarly, the electrical connection between the fixation section 31 and the wiring line 43 can be performed while securing the bonding (fixation) between the fixation section 31 and the insulating substrate 2. Here, assuming that the thickness of each of the wiring lines 41 through 43 is t, and the depth of the part of each of the recessed sections 22 through 24 described above where the wiring line 41 is disposed is d, a relationship of $t<d$ is fulfilled.

Thus, a gap not shown is formed between, for example, the stationary electrode finger 391 and the insulating film on the wiring line 41. A gap similar to this gap is also formed between each of the stationary electrode fingers and the insulating film on the wiring lines 41, 42. Due to the gap, the gas generated when performing the anodic bonding between the insulating substrate 2 and the device element 3 can be discharged in the manufacturing process of the module 1.

Similarly, although not shown in the drawings, a gap is formed between the lid member 5 and the insulating film on the wiring line 43. The gap is also formed between the lid member 5 and the insulating film on the wiring lines 41, 42. These gaps can be used for reducing the pressure in the lid member 5, or filling the inside of the lid member 5 with an inert gas. It should be noted that it is also possible to block these gaps with an adhesive when bonding the lid member 5 and the insulating substrate 2 to each other with the adhesive.

On the wiring line 41 as the first wiring line, there are disposed a plurality of projections 481 and a plurality of projections 482 as first projections having conductivity. The plurality of projections 481 is disposed so as to correspond to the stationary electrode fingers 382, 384, 386, and 388 as the plurality of first stationary electrode fingers, and the plurality of projections 482 is disposed so as to correspond to the stationary electrode fingers 392, 394, 396, and 398 as the plurality of first stationary electrode fingers.

Further, the stationary electrode fingers 382, 384, 386, and 388 and the wiring line 41 are electrically connected to each other via the plurality of projections 481, and at the same time, the stationary electrode fingers 392, 394, 396, and 398 and the wiring line 41 are electrically connected to each other via the plurality of projections 482. Thus, the electrical connection between each of the stationary electrode fingers 382, 384, 386, 388, 392, 394, 396, and 398 and the wiring line 41 can be achieved while preventing unwanted electrical connection (short circuit) between the wiring line 41 and other regions.

Similarly, on the wiring line 42 as the second wiring line, there are disposed a plurality of projections 471 and a plurality of projections 472 as second projections having conductivity. The plurality of projections 471 is disposed so as to correspond to the stationary electrode fingers 381, 383, 385, and 387 as the plurality of second stationary electrode fingers, and the plurality of projections 472 is disposed so as to correspond to the stationary electrode fingers 391, 393, 395, and 397 as the plurality of second stationary electrode fingers.

Further, the stationary electrode fingers 381, 383, 385, and 387 and the wiring line 42 are electrically connected to each other via the plurality of projections 471, and at the same time, the stationary electrode fingers 391, 393, 395, and 397 and the wiring line 42 are electrically connected to each other via the plurality of projections 472. Thus, the electrical connection between each of the stationary electrode fingers 381, 383, 385, 387, 391, 393, 395, and 397 and the wiring line 42 can be achieved while preventing unwanted electrical connection (short circuit) between the wiring line 42 and other regions.

The constituent material of such projections 471, 472, 481, and 482 is not particularly limited providing the constituent material has conductivity, and a variety of electrode materials can be used. For example, metal such as Au, Pt, Ag, Cu, and Al as a simple substance, or metal alloys including any of these metals can preferably be used. By forming the projections 471, 472, 481, and 482 using such metal as described above, the contact resistance between the wiring lines 41, 42 and the stationary electrode sections 38, 39 can be reduced.

Further, assuming that the thickness of each of the wiring lines 41 through 43 is t, the depth of the part of each of the recessed sections 22 through 24 described above where the wiring line 41 is disposed is d, and the height of each of the projections 471, 472, 481, and 482 is h, a relationship of $d \approx t+h$ is fulfilled.

Further, although not shown in the drawings, the insulating film is disposed on the wiring lines 41 through 43. It should be noted that the insulating film is not formed on the projections 471, 472, 481, and 482, and a projection 50, and the surface of each of the projections is exposed. The insulating film has a function of preventing the unwanted electrical connection (short circuit) between the conductor pattern 4 and the device element 3. Thus, the electrical connection between each of the first stationary electrode fingers 382, 384, 386, 388, 392, 394, 396, and 398 and the wiring line 41 and the electrical connection between each of the second stationary electrode fingers 381, 383, 385, 387, 391, 393, 395, and 397 and the wiring line 42 can be achieved while more reliably preventing the unwanted electrical connection (short circuit) between the wiring lines 41, 42 and other regions. Further, the electrical connection between the fixation section 31 and the wiring line 43 can be achieved while more reliably preventing the unwanted electrical connection (short circuit) between the wiring line 43 and other regions.

The insulating film is formed throughout roughly the entire area of the upper surface 2a of the insulating substrate 2 except the areas where the projections 471, 472, 481, 482, and 50, and the electrodes 44 through 46 are formed. It should be noted that the area in which the insulating film is formed is not limited to the area described above providing the insulating film can cover the wiring lines 41 through 43, and can also have a shape of, for example, excluding the bonding region of the upper surface 2a of the insulating substrate 2 with the device element 3 and the bonding region with the lid member 5.

The constituent material of such an insulating film is not particularly limited, and a variety of materials having an insulating property can be used. However, in the case in which the insulating substrate 2 is formed of a glass material (in particular, the glass material doped with the alkali metal ion), silicon dioxide ($SiO_2$) is preferably used. Thus, the unwanted electrical connection described above can be prevented, and at the same time, even in the case in which the insulating film exists in the bonding region of the upper surface 2a of the insulating substrate 2 with the device element 3, the insulating substrate 2 and the device element 3 can be bonded to each other using the anodic bonding.

Further, the thickness (the average thickness) of the insulating film is not particularly limited, but is preferably in a range of about 10 through 1000 nm, and is more preferably in a range of about 10 through 200 nm. By forming the insulating film in such a thickness range as described above, the unwanted electric connection described above can be prevented. Further, in the case in which the insulating substrate 2 is formed of a glass material including the alkali metal ion, and the device element 3 is formed using silicon as the chief material, even in the case in which the insulating film exists in the bonding region of the upper surface 2a of the insulating substrate 2 with the device element 3, the insulating substrate 2 and the device element 3 can be bonded to each other using the anodic bonding via the insulating film.

Lid Member as Second Base Member

Then, the lid member 5 as the second base member will be explained using FIGS. 1, 2, and 3. The lid member 5 has a function of protecting the device element 3 described above, and at the same time, has a function of mounting a semiconductor element 82 as a second functional element described later. The lid member 5 of the present embodiment has a plate like rectangular planar shape, and a first surface 5a (a lower surface) as one of the surfaces of the lid member 5 is provided with a first recessed section 51 disposed as a part of an internal space. The first recessed section 51 is formed so as to allow displacement of the movable section 33, the movable electrode sections 36, 37, and so on of the device element 3.

Further, a part of the first surface 5a (the lower surface) of the lid member 5 located outside the first recessed section 51 is bonded to the upper surface 2a as the principal surface of the insulating substrate 2 described above. In the present embodiment, the insulating substrate 2 and the lid member 5 are bonded to each other via an insulating film not shown. The method of bonding the lid member 5 and the insulating substrate 2 to each other is not particularly limited, and a bonding method using an adhesive, an anodic bonding method, a direct bonding method, and so on can be used. Further, the constituent material of the lid member 5 is not particularly limited providing the material can exert the function described above, and a silicon material, a glass material, and so on can preferably be used.

The semiconductor element 82 as the second functional element described later is mounted on, and connected to a top surface 5b forming the both sides of the lid member 5 together with the first surface 5a (the lower surface). The semiconductor element 82 is bonded with, for example, a resin adhesive 83 (also referred to as a die attach adhesive in some cases) as an adhesive (a bonding material) using resin as a base material. It should be noted that the semiconductor element 82 is connected to the top surface 5b of the lid member 5 so as to project toward the electrodes 44, 45, and 46 disposed on the insulating substrate 2 from an end portion of the lid member 5, wherein the end portion is located near to the electrodes 44, 45, and 46. On the upper surface of the semiconductor element 82, there are disposed bonding pads 90 for electrical connection, and the bonding pads 90 and the electrodes 44, 45, and 46 are electrically connected to each other with metal wiring lines (bonding wires) 87 as the wiring lines.

As described above, by connecting the semiconductor element 82 so as to project from the end portion of the lid member 5 toward the electrodes 44, 45, and 46, the distance in the plan view between the lid member 5 and the projection section 53 described later is decreased, and at the same time, the distance in the plan view between the lid member 5 and the electrodes 44, 45, and 46 is decreased. Thus, it becomes easy for the metal wiring lines 87 to stride over the projection section 53, thus the metal wiring lines 87 can be prevented from having contact with the projection section 53, and at the same time, the wiring lines between the lid member 5 and the electrodes 44, 45, and 46 can be shortened, and thus, it becomes easy to form a wiring shape.

Further, in the end portion of the lid member 5 located near to the electrodes 44, 45, and 46 disposed on the insulating substrate 2, there is disposed the projection section 53 extending from the lid member 5. The projection section 53 extends from an end of a flatly-disposed section, which is located on the first surface 5a side of the lid member 5, and extends from the end portion of the lid member 5 located near to the electrodes 44, 45, and 46 so as to have a thin-wall shape including the first surface 5a. The projection section 53 is disposed so as to project upward, namely toward the top surface 5b of the lid member 5, from the one end of the flatly-disposed section, and to have an end surface within the thickness of the lid member 5.

By disposing such a projection section 53, even in the case in which the resin adhesive 83 flows from the top surface 5b of the lid member 5 toward aside surface, a spilled resin adhesive 83a having flown is stopped. Thus, the spilled resin adhesive 83a fails to reach the electrodes 44, 45, and disposed on the insulating substrate 2, and the contamination of the electrodes 44, 45, and 46 by the spilled resin adhesive 83a can be inhibited, and thus, the connectivity of the metal wiring lines can be inhibited from deteriorating. Further, since the projection section 53 is formed of the same member extending from the lid member 5, the projection section 53 can be disposed without requiring an additional process. Thus, the projection section 53 can be disposed without increasing the man-hour for forming the device.

It should be noted that the projection section 53 is disposed so as to have a shape of a wall tilted so that the distance from the side surface of the lid member 5 increases as the distance from the upper surface 2a, which is the principal surface of the insulating substrate 2, increases, in other words, as the distance from the flatly-disposed section increases. In other words, the projection section 53 and the lid member 5 viewed from the front cross-sectional direction form a V-shaped recessed portion, which has the flatly-disposed section extending from the lid member 5 as the bottom surface, and is opened so as to spread upward.

By disposing such a projection section 53 forming the so-called V-shaped recessed portion as described above, the distance between the projection section 53 and the lid member 5 is decreased in the bottom portion near to the upper surface 2a of the insulating substrate 2, and thus, the surface tension of the spilled resin adhesive 83a between the projection section 53 and the lid member 5 can be increased. Thus, it becomes possible to enhance the stopping effect in the bottom portion near to the upper surface 2a of the insulating substrate 2, and thus, it becomes possible to more surely stop the spilled resin adhesive 83a.

Further, although the projection section 53 is disposed throughout the entire width in the Y-axis direction of the lid member 5, the invention is not limited to this configuration, and it is desirable that the projection section 53 is disposed in at least the area of the Y-axis direction where the electrodes 44, 45, and 46 are disposed. By adopting such a configuration as described above, it is possible to inhibit the spilled resin adhesive 83*a* from reaching the electrodes 44, 45, and 46.

Further, the side surface of the lid member 5, which is located on the side where the projection section 53 is disposed, forms a slope having a tilt toward the projection section 53. Since the side surface of the lid member 5 forms the slope as described above, the outflow resistance between the spilled resin adhesive 83*a* and the side surface is increased, and the plane area of the side surface is increased due to the slope to increase the outflow length of the spilled resin adhesive 83*a*. Thus, it becomes possible to reduce the amount of the spilled resin adhesive 83*a* reaching the projection section 53, and thus, the stopping effect of the spilled resin adhesive 83*a* by the projection section 53 can further be enhanced.

Further, the recessed sections 22, 23, and 24 traverse the bonding section between the insulating substrate 2 and the lid member 5. The recessed sections 22, 23, and 24 are grooves in which the wiring lines 41, 42, and 43 are respectively disposed. The wiring lines 41, 42, and 43 respectively connect the device element 3 and the electrodes 44, 45, and 46. The device element 3 is housed in the internal space formed by bonding the insulating substrate 2 and the lid member 5 to each other. In the present embodiment, the recessed sections 22, 23, and 24 can be filled with a sealing member disposed in an air gap between the projection section 53 and the lid member 5. By filling the recessed sections 22, 23, and 24 with the sealing member as described above, it is possible to achieve the electrical connection between the device element 3 and the electrodes 44, 45, and 46, and at the same time, easily realize the sealing property (the airtightness) of the internal space in which the device element 3 is housed.

Semiconductor Element as Second Functional Element

Then, the semiconductor element 82 as the second functional element will be explained. The semiconductor element 82 as the second functional element is, for example, an integrated circuit element (IC), and has a function of driving the module 1. The bonding pads 90 used for the electrical connection are disposed on the upper surface of the semiconductor element 82, and are connected to the electrodes 44, 45, and 46 and so on disposed on the upper surface 2*a* of the insulating substrate 2 with the metal wiring lines (the bonding wires) 87 using the wire bonding method or the like as the connection members. Further, the bonding pads 90 are connected to the respective regions of the device element 3 as the first functional element via the electrodes 44, 45, and 46 and so on. By providing an angular velocity detection circuit or an acceleration detection circuit to the semiconductor element 82, the module 1 can be configured as a gyro sensor or an acceleration sensor. It should be noted that the electrical connection can also be achieved by direct bonding using, for example, gold bumps as the connection members instead of the metal wiring lines 87.

According to the module 1 related to the first embodiment explained hereinabove, in the end portion of the lid member 5 located near to the electrodes 44, 45, and 46, there is disposed the projection section 53 extending from the lid member 5. By disposing such a projection section 53, even in the case in which the resin adhesive 83 flows from the top surface 5*b* of the lid member 5 on the side surface, the spilled resin adhesive 83*a* having flown is stopped by the projection section 53. Thus, the spilled resin adhesive 83*a* fails to reach the electrodes 44, 45, and 46 disposed on the insulating substrate 2, and the contamination of the electrodes 44, 45, and 46 by the spilled resin adhesive 83*a* can be inhibited, and thus, the deterioration of the connectivity to the metal wiring lines 87 and so on can be inhibited. Further, since the projection section 53 is formed of the same member extending from the lid member 5, the projection section 53 can be disposed without requiring an additional process.

Method of Manufacturing Module

Then, a method of manufacturing the module will be explained with reference to FIGS. 4A through 4D. FIGS. 4A through 4D are process diagrams showing an outline of the manufacturing process of the module, and are each a front cross-sectional view of the lid member, the insulating substrate, the device element, and so on. It should be noted that in the drawings, the state of being arranged on a wafer and formed by a batch process, namely the method of manufacturing the module before the wafer is separated into individual modules will be explained. Further, in some cases, the same constituents as in the above description is denoted with the same reference symbols, and the explanation thereof will be omitted.

Figure 4A:
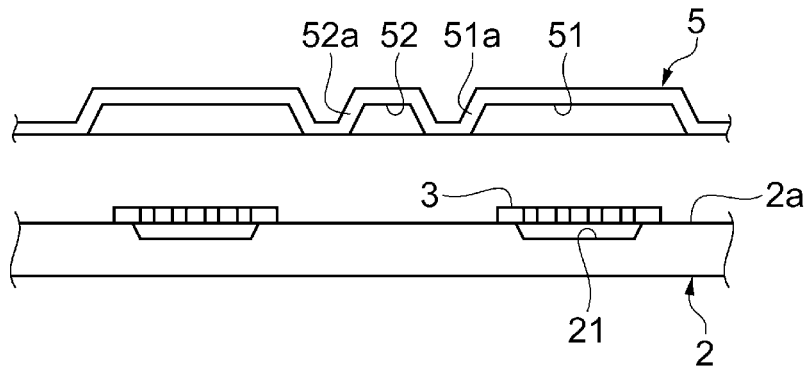
FIGS. 4A through 4D are process diagrams showing an outline of the manufacturing process of the module.

Firstly, as shown in FIG. 4A, the lid member 5 as the second base member provided with the first recessed section 51 as a part of the internal space dug from the first surface (the lower surface) as the one of the surfaces, and a second recessed section 52 dug from the first surface (the lower surface) as the one of the surfaces is prepared. It should be noted that the first recessed section 51 is surrounded by a first wall section 51*a*, and the second recessed section 52 is surrounded by a second wall section 52*a*. The constituent material of the lid member 5 is not particularly limited providing the material can exert the function described above, and a silicon material, a glass material, and so on can preferably be used. It should be noted that the formation of the first recessed section 51 and the second recessed section 52 can be performed using the photolithography technology, the etching technology, and so on.

Further, as shown in FIG. 4A, the insulating substrate 2 as the first base member provided with the hollow section 21 disposed in the upper surface 2*a* (the bonding surface as the one of the surfaces) as a part of the internal space is prepared. As the constituent material of the insulating substrate 2, specifically, a silicon material and a glass material having a high resistivity are preferably used, and in particular, in the case in which the element 3 is made of the silicon material as a chief material, a glass material (e.g., borosilicate glass such as Pyrex (registered trademark) glass) including an alkali metal ion (a movable ion) is preferably used. Then, the device element 3 is bonded to the upper surface (the one of the surfaces) 2*a* of the insulating substrate 2 so as to be opposed to the hollow section 21.

Figure 4B:
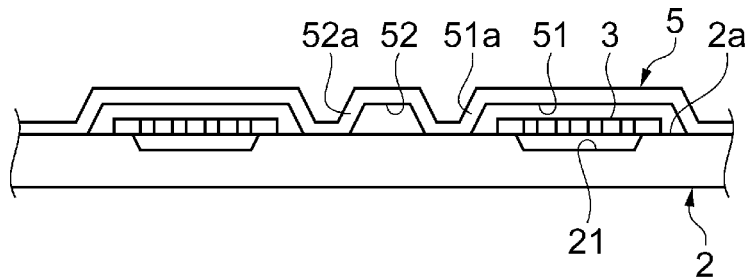

Then, as shown in FIG. 4B, the lid member 5 is bonded so that the first surface (the lower surface) as the one of the surfaces is opposed to the upper surface (the bonding surface as the one of the surfaces) 2*a* of the insulating substrate 2 on the side where the hollow section 21 is disposed. On this occasion, the insulating substrate 2 and the lid member 5 are bonded to each other so that the device element 3 is housed in the cavity (the internal space) constituted by the hollow section 21 and the first recessed section 51, and at the same time, the second recessed section 52 is located near to the electrodes 44, 45, and 46 (see FIG. 1) disposed on the upper surface (the bonding surface) 2*a* of the insulating substrate 2. In the bonding process, there can be used a bonding process using, for example, a paste including glass, the anodic bonding process, and so on.

Figure 4C:
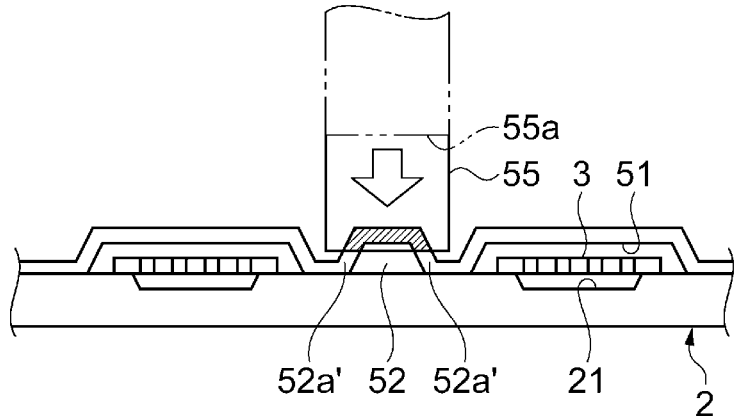
Figure 4D:
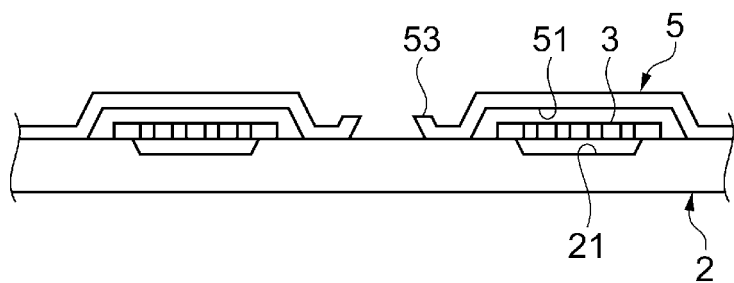

Subsequently, as shown in FIGS. 4C and 4D, a half dicing process using a dicing blade 55 is performed to thereby form the projection section 53. In the half dicing process, by moving the dicing blade 55 from the position 55*a* to the position where a part 52*a*' of the second wall section 52*a* remains, a part of the second recessed section 52 indicated by hatching in FIG. 4C is removed. Here, as shown in FIG. 4D, it results that the part 52*a*' of the second wall section 52*a* having remained unremoved is formed as the projection section 53.

Subsequently, although not shown in the drawings, the module 1 is separated from the wafer using a cutting device such as a dicing saw to thereby form the module 1 as an individual device shown in FIGS. 1 through 3.

According to such a method of manufacturing the module, the projection section 53 can be disposed using a part of the second wall section 52*a* of the second recessed section 52 previously provided to the lid member 5. Therefore, the projection section 53 can be disposed with a simple and easy process to suppress increase in man-hour. Further, the projection section 53 can easily be disposed using the half dicing process.

Second Embodiment

Figure 5A:
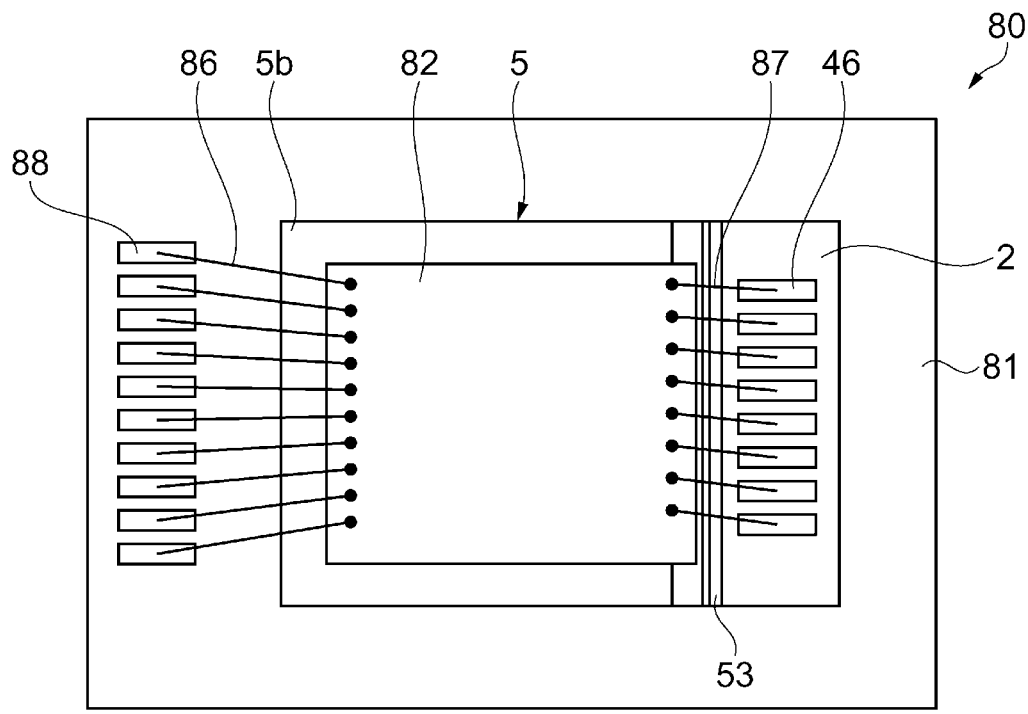
Figure 5B:
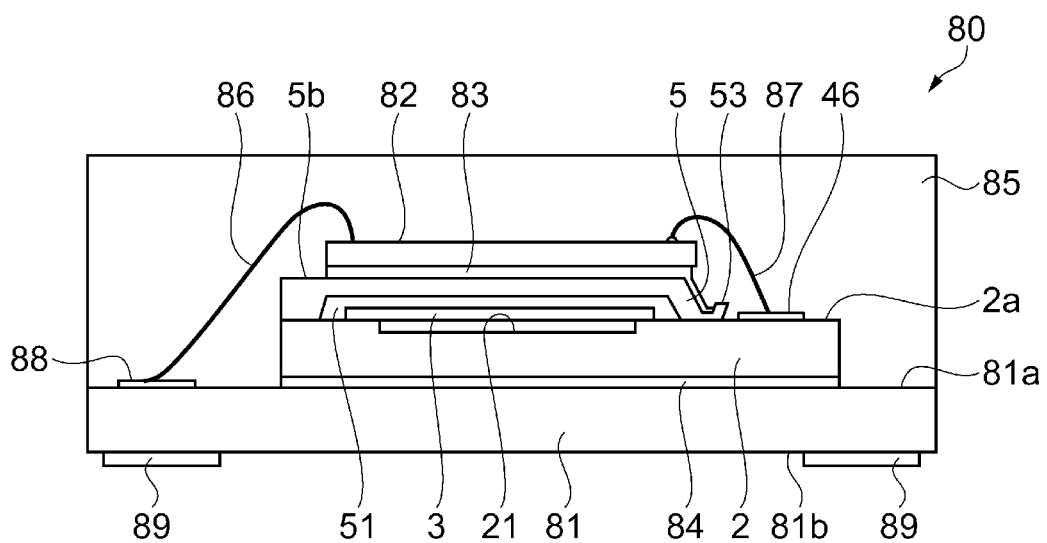

A module according to a second embodiment of the invention will be explained using FIGS. 5A and 5B. FIGS. 5A and 5B are diagrams schematically showing the module according to the second embodiment of the invention, wherein FIG. 5A is a plan view, and FIG. 5B is a front cross-sectional view. It should be noted that in the explanation of the second embodiment, the same constituents as in the first embodiment described above are denoted with the same reference symbols, and the explanation thereof will be omitted. It should be noted that FIG. 5A shows a state of eliminating a mold member constituting the module.

The module 80 shown in FIG. 5 is provided with a base substrate 81, the insulating substrate 2 as the first base member connected to the base substrate 81, the device element 3 as the first functional element bonded to and supported by the insulating substrate 2, and the lid member 5 as the second base member disposed so as to cover the device element 3. Further, the module 80 includes the semiconductor element 82 as the second functional element connected to an upper surface 5*b* of the lid member 5 with the resin adhesive 83 (also referred to as the die attach adhesive), and the projection section 53 extending from the lid member 5. Further, the module 80 has a mold member 85 disposed so as to cover the upper surface 81*a* of the base substrate 81, the insulating substrate 2, the lid member 5, the semiconductor element 82, and so on.

Hereinafter, the configuration of the module 80 will be explained. The insulating substrate 2, the device element 3, the lid member 5, and the semiconductor element 82 are substantially the same constituents as in the first embodiment described above, and are therefore denoted with the same reference symbols, and the explanation thereof will be simplified or omitted in some cases.

The base substrate 81 has a plate like rectangular planar shape, and the insulating substrate 2 is mounted on and connected to the upper surface 81*a* of the base substrate 81. The constituent material of the base substrate 81 is not particularly limited providing the electrical insulating property is ensured, but a ceramic substrate, an epoxy resin substrate, and so on are preferably used. In the present embodiment, the explanation will be presented using the example of adopting a ceramic substrate.

The insulating substrate 2 is connected and fixed to the upper surface 81*a* of the base substrate 81 using, for example, an epoxy resin adhesive 84. Further, in a part of the upper surface 81*a* of the base substrate 81 in which the insulating substrate 2 is not mounted, there are disposed two or more connection terminals 88, ten connection terminals 88 in the present embodiment, and on a lower surface 81*b* as a surface on the opposite side to the upper surface 81*a*, there are disposed external connection terminals 89. The connection terminals 88 are respectively connected to the corresponding external connection terminals 89 and so on via a wiring pattern not shown formed on the upper surface 81*a* of the base substrate 81 or in-layer wiring such as through holes. The connection terminals 88, the external connection terminals 89, and the wiring pattern for connecting these terminals to each other are typically formed by printing a metal wiring material such as tungsten (W) or molybdenum (Mo) on the ceramic insulating material by screen printing, calcining the material, and then performing plating of nickel (Ni), gold (Au), or the like on the material. It should be noted that although in the drawing, the explanation is presented using the example in which the insulating substrate 2 is directly connected to the base substrate 81 with the resin adhesive 84, it is also possible to adopt a configuration in which connection pads (not shown) disposed similarly to the connection terminals 88 are disposed on the upper surface 81*a* of the base substrate 81 opposed to the insulating substrate 2.

On the insulating substrate 2, there are disposed the device element 3 bonded to and supported by the insulating substrate 2, the lid member 5 as the second base member disposed so as to cover the device element 3, and the semiconductor element 82 connected to the upper surface 5*b* of the lid member 5 with the resin adhesive 83. The semiconductor element 82 is connected to the top surface 5*b* (an upper surface) of the lid member 5 so as to project toward the electrodes 46 disposed on the insulating substrate 2 from an end portion of the lid member 5, wherein the end portion is located near to the electrodes 46.

As described above, by connecting the semiconductor element 82 so as to project from the end portion of the lid member 5 toward the electrodes 46, the distance in the plan view between the lid member 5 and the projection section 53 described later is decreased, and at the same time, the distance in the plan view between the lid member 5 and the electrodes 46 is decreased. Thus, it becomes easy for the metal wiring lines 87 to stride over the projection section 53, thus the metal wiring lines 87 can be prevented from having contact with the projection section 53, and at the same time, the wiring lines between the lid member 5 and the electrodes 46 can be shortened, and thus, it becomes easy to form a wiring shape.

Further, similarly to the first embodiment described above, in the end portion of the lid member 5 located near to the electrodes 46 disposed on the insulating substrate 2, there is disposed the projection section 53 extending from the lid member 5. The projection section 53 extends from an end of a flatly-disposed section, which is located on the first surface (the lower surface) side of the lid member 5, and extends from the end portion of the lid member 5 located near to the electrodes 46 so as to have a thin-wall shape including the first surface (the lower surface). The projection section 53 is disposed so as to project upward, namely toward the top surface 5*b* (the upper surface) of the lid member 5, from the one end of the flatly-disposed section, and to have an end surface within the thickness of the lid member 5. The projection section 53 is disposed so as to have a shape of a wall tilted so that the distance from the side surface of the lid member 5 increases as the distance from the upper surface 2a, which is the principal surface of the insulating substrate 2, increases, in other words, as the distance from the flatly-disposed section increases. In other words, the projection section 53 and the lid member 5 viewed from the front cross-sectional direction form a V-shaped recessed portion, which has the flatly-disposed section extending from the lid member 5 as the bottom surface, and is opened so as to spread upward.

Further, the connection pads (not shown) of the semiconductor element 82 and the electrodes 46 disposed on the upper surface 2a of the insulating substrate 2 are connected to each other with the metal wiring lines (the bonding wires) 87 as the connection members, and the connection pads (not shown) of the semiconductor element 82 and the connection terminals 88 disposed on the upper surface 81a of the base substrate 81 are connected to each other with metal wiring lines 86 as the connection members. It should be noted that although in the drawing, the eight metal wiring lines 87 and the ten metal wiring lines 86 are shown as an example, the number of metal wiring lines is not particularly limited, but any number can be adopted. Further, the electrical connection can also be achieved by direct bonding using, for example, gold bumps as the connection members instead of the metal wiring lines 86, 87.

The upper surface 81a of the base substrate 81, the insulating substrate 2 connected to the upper surface 81a of the base substrate 81, the lid member 5, the semiconductor element 82, the metal wiring lines 87, and the metal wiring lines 86 are covered by the mold member 85 as a covering member made of insulating resin or the like. The mold member 85 is formed of thermosetting resin (e.g., epoxy resin) using, for example, a transfer molding process. It should be noted that although the mold member 85 of the present embodiment has a configuration of having a peripheral surface along the periphery of the base substrate 81, the mold member 85 is not necessarily required to have a shape following the periphery of the base substrate. The mold member 85 can have any shape providing the mold member 85 can cover the member and the part which need to be covered. Further, the upper surface of the mold member 85 can have an uneven shape instead of the flat shape (the flat planar shape).

According to the module 80 related to the second embodiment described above, the base substrate 81, the insulating substrate 2 and the lid member 5 bonded to each other having the device element 3 housed in the internal space, and the semiconductor element 82 connected to the upper surface 5b of the lid member 5 are covered by the mold member 85. Therefore, it becomes possible to realize a tight module operable by a single package without increasing the plane area.

In addition to the above, according to the module 80 related to the second embodiment, in the end portion of the lid member 5 located near to the electrodes 46, there is disposed the projection section 53 extending from the lid member 5 similarly to the case of the first embodiment. By disposing such a projection section 53, even in the case in which the resin adhesive 83 flows from the top surface 5b of the lid member 5 toward the side surface, the resin adhesive is stopped by the projection section 53. Thus, the resin adhesive 83 having flown fails to reach the electrodes 46 disposed on the insulating substrate 2, and the contamination of the electrodes 46 by the resin adhesive 83 having flown can be inhibited, and thus, the deterioration of the connectivity to the metal wiring lines 87 and so on can be inhibited.

Further, since the projection section 53 is formed of the same member extending from the lid member 5, the projection section 53 can be disposed without requiring an additional process.

It should be noted that although in the module 80 described above, the explanation is presented using the example of mounting the module having a single device element 3 on the base substrate 81, the invention is not limited to this example, but can also be applied to a sensor as a module having a configuration of mounting a plurality of modules on the base substrate 81.

Electronic Apparatus

Then, the electronic apparatuses to which the module 1 according to an embodiment of the invention is applied will be explained in detail with reference to FIGS. 6 through 8. It should be noted that in the explanation, there is described an example to which the module 1 provided with the device element 3 for detecting the angular velocity is applied.

Figure 6:
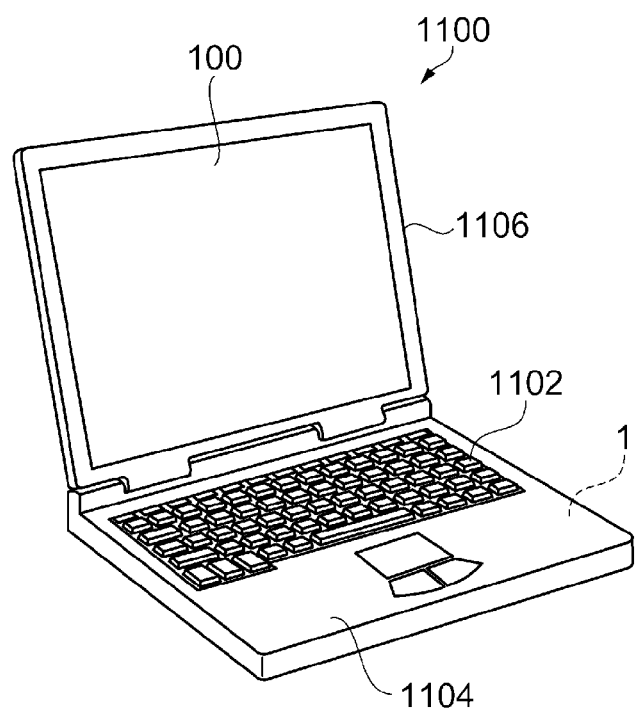
FIG. 6 is a perspective view showing a configuration of a mobile personal computer as an example of the electronic apparatus.

FIG. 6 is a perspective view showing a schematic configuration of a mobile type (or a laptop type) personal computer as the electronic apparatus equipped with the module 1 according to an embodiment of the invention. In the drawing, the personal computer 1100 includes a main body section 1104 provided with a keyboard 1102, and a display unit 1106 provided with a display section 100, and the display unit 1106 is pivotally supported with respect to the main body section 1104 via a hinge structure. Such a personal computer 1100 incorporates the module 1 provided with the function of detecting the angular velocity.

Figure 7:
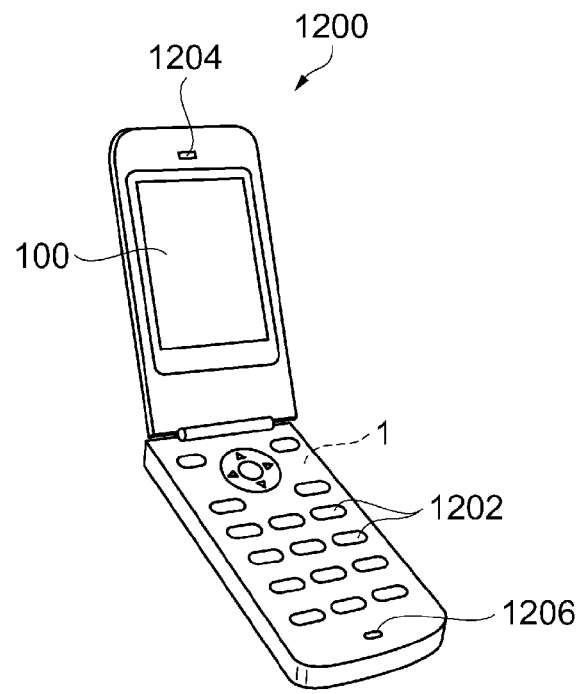
FIG. 7 is a perspective view showing a configuration of a cellular phone as an example of the electronic apparatus.

FIG. 7 is a perspective view showing a schematic configuration of a cellular phone (including PHS) as the electronic apparatus equipped with the module 1 according to an embodiment of the invention. In this drawing, the cellular phone 1200 is provided with a plurality of operation buttons 1202, an ear piece 1204, and a mouthpiece 1206, and the a display section 100 is disposed between the operation buttons 1202 and the ear piece 1204. Such a cellular phone 1200 incorporates the module 1 functioning as an angular velocity sensor, and so on.

Figure 8:
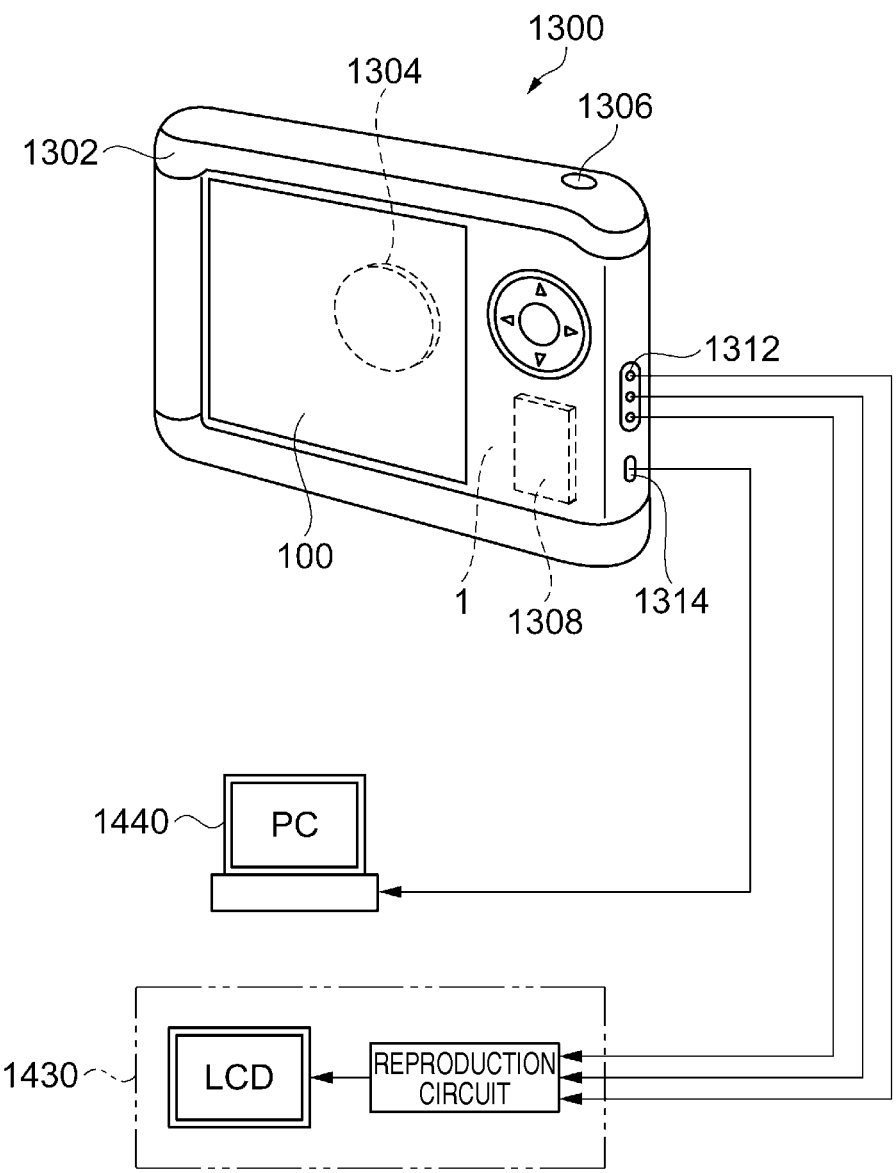
FIG. 8 is a perspective view showing a configuration of a digital still camera as an example of the electronic apparatus.

FIG. 8 is a perspective view showing a schematic configuration of a digital still camera as the electronic apparatus equipped with the module 1 according to an embodiment of the invention. It should be noted that the connection with external equipment is also shown briefly in this drawing. Here, the conventional film cameras expose a silver salt film to an optical image of an object, while the digital still camera 1300 performs photoelectric conversion on an optical image of an object by an imaging element such as a CCD (a charge coupled device) to generate an imaging signal (an image signal).

A case (a body) 1302 of the digital still camera 1300 is provided with a display section 100 disposed on the back surface of the case 1302 to provide a configuration of performing display in accordance with the imaging signal from the CCD, wherein the display section 100 functions as a viewfinder for displaying the object as an electronic image. Further, the front surface (the reverse side in the drawing) of the case 1302 is provided with a light receiving unit 1304 including an optical lens (an imaging optical system), the CCD, and so on.

When the photographer checks an object image displayed on the display section 100, and then holds down a shutter button 1306, the imaging signal from the CCD at that moment is transferred to and stored in a memory device 1308. Further, the digital still camera 1300 is provided with video signal output terminals 1312 and an input/output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, there is adopted the configuration in which the imaging signal stored in the memory device 1308 is output to the television monitor 1430 and the personal computer 1440 in accordance with a predetermined operation. Such a digital still camera 1300 incorporates the module 1 functioning as an angular velocity sensor, and so on.

It should be noted that, the module 1 according to an embodiment of the invention can also be applied to an electronic apparatus such as an inkjet ejection device (e.g., an inkjet printer), a laptop personal computer, a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer (the mobile personal computer) shown in FIG. 6, the cellular phone shown in FIG. 7, and the digital still camera shown in FIG. 8.

Moving Object

Figure 9:
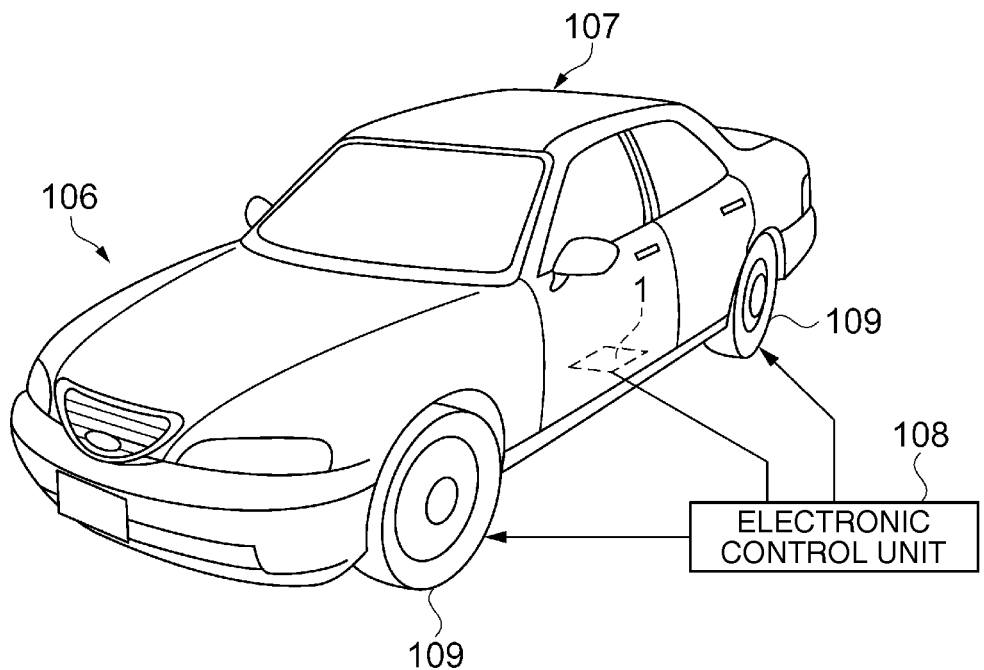
FIG. 9 is a perspective view showing a configuration of a vehicle as an example of a moving object.

FIG. 9 is a perspective view schematically showing a vehicle as an example of the moving object. The vehicle 106 is equipped with the module 1 according to the invention. For example, as shown in the drawing, in the vehicle 106 as the moving object, an electronic control unit 108 incorporating the module 1 and for controlling tires 109 and so on is installed in a vehicle body 107. Further, besides the above, the module 1 can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle posture control system.

The entire disclosure of Japanese Patent Application No. 2013-056201, filed Mar. 19, 2013 is expressly incorporated by reference herein.

What is claimed is:

1. A module comprising:
a first base member;
a second base member having an internal space with the first base member, and bonded to a principal surface of the first base member;
a first functional element housed in the internal space;
a second functional element connected to a surface of the second base member on an opposite side to the internal space with a bonding member;
an electrode electrically connected to the first functional element, and disposed on the principal surface of the first base member in an area other than a connection area with the second base member; and
a projection section on only a single side of the second base member, formed of a same member as the second base member, and disposed on the principal surface in an area between the electrode and the second base member in a plan view,
wherein the second base member engages with the first base member to entirely cover the first functional element.

2. The module according to claim 1, wherein
a distance between the projection section and the second base member on a tip side of the projection section is longer than a distance between the projection section and the second base member on the principal surface side.

3. The module according to claim 2, wherein
the second base member has a slope as a side surface near to an area where the projection section is provided.

4. The module according to claim 1, wherein
the second base member has a slope as a side surface near to an area where the projection section is provided.

5. The module according to claim 1, wherein
the second functional element is connected so as to project from the surface of the second base member on the opposite side to the internal space toward the electrode.

6. The module according to claim 1, wherein
the principal surface of the first base member is provided with a groove,
the first functional element and the electrode are electrically connected to each other with a wiring line disposed in the groove, and
the groove is filled with a sealing member disposed in a gap between the projection section and the second base member.

7. An electronic apparatus comprising:
the module according to claim 1.

8. A moving object comprising:
the module according to claim 1.

9. The module according to claim 1, wherein the second functional element extends beyond an edge of the second base member.

10. A method of manufacturing a module comprising:
preparing a second base member provided with a first recessed section having a first wall section, and a second recessed section having a second wall section both disposed in a first surface, and a first base member having a hollow section disposed in a principal surface;
bonding the second base member and the first base member to each other so that the first recessed section and the hollow section are opposed to each other; and
removing the second base member in an area where the second recessed section and the second wall section are formed so that a part of the second wall section remains.

11. The method of manufacturing a module according to claim 10, wherein
a half dicing process is used in the removing of the second base member.

12. A module comprising:
a first base member;
a second base member having an internal space with the first base member, and bonded to a principal surface of the first base member;
a first functional element housed in the internal space;
a second functional element connected to a surface of the second base member on an opposite side to the internal space with a bonding member;
an electrode electrically connected to the second functional element by a plurality of metal wiring lines, and disposed on the principal surface of the first base member in an area other than a connection area with the second base member; and a projection section on only a single side of the second base member, formed of a same member as the second base member, and disposed on the principal surface in an area between the electrode and the second base member in a plan view, wherein the plurality of metal wiring lines intersect with the projection section in the plan view, wherein the second base member engages with the first base member to entirely cover the first functional element.

\* \* \* \* \*